US011332822B2

(12) United States Patent
Han et al.

(10) Patent No.: US 11,332,822 B2
(45) Date of Patent: May 17, 2022

(54) SYSTEMS AND METHODS FOR IMPROVED VAPOR DEPOSITION ON COMPLEX GEOMETRY COMPONENTS

(71) Applicant: GM GLOBAL TECHNOLOGY OPERATIONS LLC, Detroit, MI (US)

(72) Inventors: Su Jung Han, West Bloomfield, MI (US); Julie A. Swartz, Commerce Township, MI (US); Grant W. Brady, Howell, MI (US)

(73) Assignee: GM Global Technology Operations LLC, Detroit, MI (US)

( * ) Notice: Subject to any disclaimer, the term of this patent is extended or adjusted under 35 U.S.C. 154(b) by 195 days.

(21) Appl. No.: 16/664,129

(22) Filed: Oct. 25, 2019

(65) Prior Publication Data

US 2021/0123132 A1   Apr. 29, 2021

(51) Int. Cl.
*C23C 14/54* (2006.01)
(52) U.S. Cl.
CPC ............................ *C23C 14/541* (2013.01)
(58) Field of Classification Search
None
See application file for complete search history.

(56) References Cited

U.S. PATENT DOCUMENTS 6,416,577 B1 * 7/2002 Suntoloa ............... C23C 16/045
117/200
2016/0369396 A1 * 12/2016 Sammelselg ..... C23C 16/45555

\* cited by examiner

*Primary Examiner* — Shamim Ahmed
*Assistant Examiner* — Bradford M Gates
(74) *Attorney, Agent, or Firm* — Quinn IP Law

(57) ABSTRACT

An exemplary method of depositing a layer of a material on an interior substrate surface of a complex geometry component includes the steps of providing the complex geometry component having an aperture defining an edge of the interior substrate surface of the complex geometry component, at least a portion of the interior substrate surface defining a first area not visible from the aperture, providing a heating element adjacent to the first area of the complex geometry component, energizing the heating element to raise a surface temperature of the first area and establish a thermal gradient between the first area and an adjacent area, and providing a vapor deposition apparatus configured to deposit the layer of material on the interior substrate surface corresponding to the first area of the complex geometry component.

15 Claims, 2 Drawing Sheets

SYSTEMS AND METHODS FOR IMPROVED VAPOR DEPOSITION ON COMPLEX GEOMETRY COMPONENTS

INTRODUCTION

The present disclosure relates generally to a vapor deposition process on non-line of sight surfaces of complex geometry components.

Vapor deposition processes are used to produce components with superior hardness, wear resistance, smoothness, and oxidation resistance. Thin films applied through vapor deposition process are typically able to function in unique, high-stress environments. Physical vapor deposition processes are techniques that use primarily physical means to deposit a thin layer of material. However, physical vapor deposition processes are "line of sight" techniques, meaning these processes are not ideal for coating non-visible surfaces such as those in complex geometries.

SUMMARY

Embodiments according to the present disclosure provide a number of advantages. For example, embodiments according to the present disclosure improve deposition efficiency on non-line of sight locations and improve uniformity of metallic coating coverage on complex geometry components through the use of local heating.

In one aspect of the present disclosure, a method of depositing a layer of a material on an interior substrate surface of a complex geometry component includes the steps of providing the complex geometry component having an aperture defining an edge of the interior substrate surface of the complex geometry component, at least a portion of the interior substrate surface defining a first area not visible from the aperture, providing a heating element adjacent to the first area of the complex geometry component, energizing the heating element to raise a surface temperature of the first area, and providing a vapor deposition apparatus configured to deposit the layer of material on the interior substrate surface corresponding to the first area of the complex geometry component.

In some aspects, the heating element is a coil-type heater.

In some aspects, the heating element is placed adjacent to an exterior surface of the complex geometry component corresponding to the first area.

In some aspects, the heating element creates a thermal gradient between the first area and a second area of the complex geometry component adjacent to the first area such that a temperature of the interior substrate surface at the first area is greater than a temperature of the interior substrate surface at the second area.

In some aspects, the thermal gradient is at least one hundred (100) degrees.

In some aspects, the second area is visible from the aperture.

In some aspects, the layer of material is comprised of one of a metallic material and a ceramic material.

In some aspects, the metallic material is one of nickel, a nickel alloy, copper, and a copper alloy.

In another aspect of the present disclosure, a method of depositing a coating layer of a material on an interior substrate surface of a complex geometry component includes providing the complex geometry component having a first aperture defining an edge of a first interior substrate surface of the complex geometry component, a second aperture defining an edge of a second interior substrate surface of the complex geometry component, wherein at least a portion of the first interior substrate surface is a first area that is not within a line of sight of the first aperture and at least a portion of the second interior substrate surface is a second area that is not within a line of sight of the second aperture. The method also includes providing a first heating element adjacent to the first area of the complex geometry component, providing a second heating element adjacent to the second area of the complex geometry component, energizing the first heating element to raise a surface temperature of the first area, energizing the second heating element to raise a surface temperature of the second area, vapor depositing a first coating on the first area, and vapor depositing a second coating on the second area.

In some aspects, each of the first and second heating elements is a coil-type heater.

In some aspects, the first heating element is placed adjacent to an exterior surface of the complex geometry component corresponding to the first area and the second heating element is placed adjacent to an exterior surface of the complex geometry component corresponding to the second area.

In some aspects, the first heating element creates a first thermal gradient between the first area and a third area of the complex geometry component adjacent to the first area such that a temperature of the interior substrate surface at the first area is greater than a temperature of the interior substrate surface at the third area.

In some aspects, a difference between a surface temperature at the first area and a surface temperature at the third area is greater than one hundred (100) degrees.

In some aspects, the second heating element creates a second thermal gradient between the second area and a fourth area of the complex geometry component adjacent to the second area such that a temperature of the interior substrate surface at the second area is greater than a temperature of the interior substrate surface at the fourth area.

In some aspects, the first coating is one of a metallic material and a ceramic material.

In some aspects, the second coating is one of a metallic material and a ceramic material.

In some aspects, the metallic material is one of nickel, a nickel alloy, copper, and a copper alloy.

In another aspect of the present disclosure, a system for improving vapor deposition on an interior substrate surface includes a complex geometry component having an exterior surface and a first aperture defining a first edge of the interior substrate surface and a bend creating a curve in the interior substrate surface such that at least a first area of the interior substrate surface is not visible from the first aperture and a heating element placed adjacent to the first area, the heating element generating a thermal gradient between the first area of the interior substrate surface and a second area adjacent to the first area.

In some aspects, the heating element is a coil-type heater.

In some aspects, the heating element is placed adjacent to an exterior surface of the complex geometry component corresponding to the first area such that the heating element creates a thermal gradient between the interior substrate surface of the complex geometry component at the first area and the interior substrate surface of the complex geometry component at the second area of the complex geometry component.

BRIEF DESCRIPTION OF THE DRAWINGS

The present disclosure will be described in conjunction with the following figures, wherein like numerals denote like elements.

Figure 1:
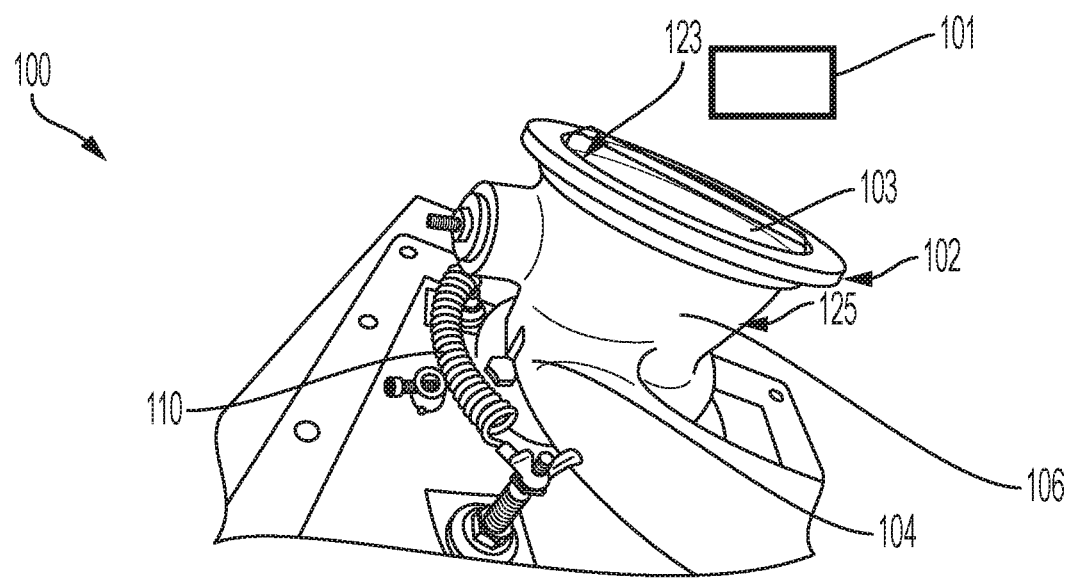
FIG. 1 is a schematic diagram of a complex geometry component including a local heater, according to an embodiment of the invention.

The foregoing and other features of the present disclosure will become more fully apparent from the following description and appended claims, taken in conjunction with the accompanying drawings. Understanding that these drawings depict only several embodiments in accordance with the disclosure and are not to be considered limiting of its scope, the disclosure will be described with additional specificity and detail through the use of the accompanying drawings. Any dimensions disclosed in the drawings or elsewhere herein are for the purpose of illustration only.

DETAILED DESCRIPTION

Embodiments of the present disclosure are described herein. It is to be understood, however, that the disclosed embodiments are merely examples and other embodiments can take various and alternative forms. The figures are not necessarily to scale; some features could be exaggerated or minimized to show details of particular components. Therefore, specific structural and functional details disclosed herein are not to be interpreted as limiting, but merely as a representative basis for teaching one skilled in the art to variously employ the present disclosure. As those of ordinary skill in the art will understand, various features illustrated and described with reference to any one of the figures can be combined with features illustrated in one or more other figures to produce embodiments that are not explicitly illustrated or described. The combinations of features illustrated provide representative embodiments for typical applications. Various combinations and modifications of the features consistent with the teachings of this disclosure, however, could be desired for particular applications or implementations.

Certain terminology may be used in the following description for the purpose of reference only, and thus are not intended to be limiting. For example, terms such as "above" and "below" refer to directions in the drawings to Which reference is made. Terms such as "front," "back," "left," "right," "rear," and "side" describe the orientation and/or location of portions of the components or elements within a consistent but arbitrary frame of reference which is made clear by reference to the text and the associated drawings describing the components or elements under discussion. Moreover, terms such as "first," "second," "third," and so on may be used to describe separate components. Such terminology may include the words specifically mentioned above, derivatives thereof, and words of similar import.

Typically, vapor deposition processes apply coating through line of sight techniques, that is, the area targeted for the coating application is visible from position of the vapor deposition apparatus. However, line of sight techniques do not enable effective coating deposition on complex geometry components that may include multiple apertures and shapes including turns, curves, etc. that limit the line of sight to interior surface areas, for example and without limitation. In various embodiments, for complex geometry components having single or multiple apertures (inlet and outlet apertures), changing the position of the vapor deposition apparatus may improve line of sight to one or more interior areas of the component, allowing for application of a coating material to a desired thickness using line of sight techniques. However, curves, bends, turns, or other features of the component may limit line of sight access to one or more areas, even after changing the position of the vapor deposition apparatus. The methods and systems discussed herein result in robust coating on otherwise difficult to reach areas of complex geometry components, such as, for example and without limitation, the interior surfaces of turbines.

FIG. 1 illustrates elements of a system 100 for depositing a coating on the surface or substrate of a complex geometry component using vapor deposition. In various embodiments, the coating includes a metallic material, such as, for example and without limitation, nickel and nickel alloys and copper and copper alloys. In various embodiments, the coating is a ceramic material. The system 100 includes the complex geometry component 102, which, in some embodiments, is a component having multiple turns, curves, etc. such that a vapor deposition apparatus 101 does not have line of sight to all of the interior surfaces of the component. In other words, portions of the interior surface of the component are not visible from an aperture through which the coating is applied via vapor deposition techniques. In various embodiments, the complex geometry component is a turbine, multichamber component, or other complex geometry component (that is, a component having multiple curves or other features such that portions of the interior surface of the component are not visible from an aperture of the component), for example and without limitation.

In some embodiments, the complex geometry component 102 includes at least one aperture 103 through which the vapor deposition material is applied to an interior substrate surface 123 of the complex geometry component 102. The aperture 103 defines an edge of the interior substrate surface 123 of the complex geometry component 102. The complex geometry component 102 includes a curve, bend, or other feature. The curve, bend or other feature limits line of sight to at least one area 104, resulting in lack of deposition of a coating to the at least one area 104 of the complex geometry component 102 during a vapor deposition process. The interior substrate surface 123 of the complex geometry component 102 at the area 104 is not visible from the aperture 103, that is, the interior substrate surface 123 of the component 102 at the area 104 is not within a line of sight of the vapor deposition apparatus 101 adjacent to and directing a coating into the aperture 103. The area 104 is adjacent to an area 106 that is within a line of sight of the vapor deposition apparatus 101 directing the coating into the aperture 103.

In various embodiments, it is impractical or impossible to position the vapor deposition apparatus such that the area 104 is within a line of sight of the apparatus. As a result, vapor deposition results in uneven coating or undesired thickness of the coating material at the area 104.

A heating element such as a heater 110 is placed adjacent to the area 104 in contact with or adjacent to an exterior surface 125 of the complex geometry component 102. The heater 110 is energized during the vapor deposition process. The heater 110 increases the surface free energy at the area 104 by increasing the surface temperature of the interior substrate surface 123 located at the area 104 and decreasing the humidity at the area 104 relative to the temperature of the interior substrate surface adjacent to the area 104, increasing the vapor deposition material collision rate with the substrate and improving deposition efficiency at the area 104 to achieve a desired material coating thickness. In various embodiments, the heater 110 is a local heater placed adjacent to and/or in contact with at least a portion of an exterior surface of the complex geometry component 102 at the area 104 such that the heater 110 heats the interior substrate surface of the complex geometry component 102 at the area 104 to create a thermal gradient between area 104 and adjacent areas (such as the area 106) of the complex geometry component 102. In various embodiments, the heater 110 is a coil-type heater but any other type of local heater may be used to heat the substrate of the area 104.

The heater 110 is placed on or adjacent to the external surface 125 of the complex geometry component 102 at or in the vicinity of the area 104 such that the energy generated by the heater 110 heats the interior substrate surface 123 of the component 102 at the area 104. In various embodiments, adjacent interior substrate surface areas of the complex geometry component 102 (such as the area 106) are areas adjacent to the non-line of sight area 104 in which traditional line of sight vapor deposition processes have resulted in a desired coating thickness. Creation of a thermal gradient between the area 104 and the area 106 results in improved deposition of the coating material at the area 104 and a more uniform deposition of material between the non-line of sight area 104 and the adjacent, line of sight areas. In various embodiments, the temperature gradient is approximately one hundred (100) degrees. In other embodiments, the temperature gradient is greater than one hundred (100) degrees.

Figure 2:
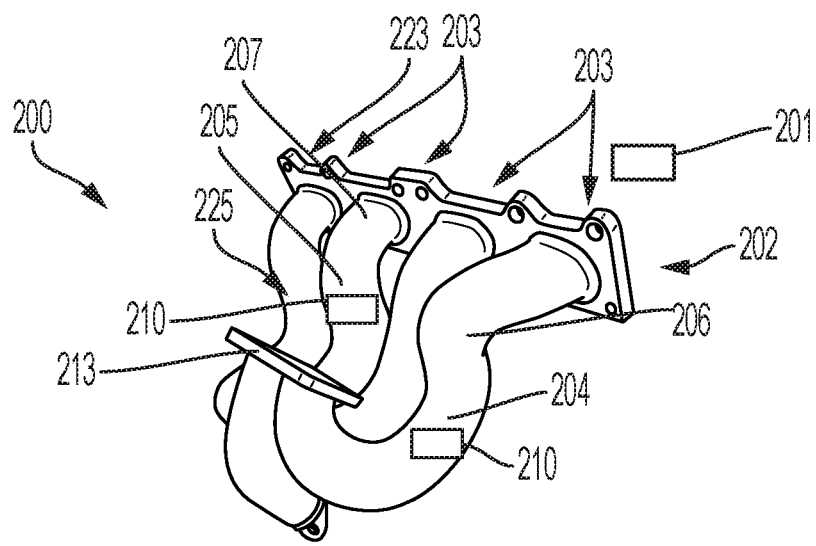
FIG. 2 is a schematic diagram of another complex geometry component including a plurality of local heaters, according to an embodiment of the invention.

In another embodiment, shown in FIG. 2, a system 200 includes a plurality of heaters used to heat one or more interior substrate surfaces 223 of multiple areas of the complex geometry component 202 to create multiple thermal gradients within the interior substrate surfaces of the complex geometry component 202. The complex geometry component 202 includes a plurality of curved sections that result in areas in which typical vapor deposition processes are ineffective at depositing a uniform coating of material on the interior surface or substrate of the component 202, that is, portions of an interior surface of the complex geometry component 202 are out of line of sight of the vapor deposition apparatus 201. The complex geometry component 202 includes multiple apertures 203, each aperture defining an edge of an interior substrate surface 223 of the complex geometry component 202. As shown in FIG. 2, for example, four apertures 203 define four edges and four interior substrate surfaces 223 of the complex geometry component 202. The vapor deposition apparatus 201 is, in some embodiments, placed adjacent to one or more of the apertures 203 to direct a coating material into each aperture to cover the interior substrate surface 223. The position of the vapor deposition apparatus 201 may be adjusted to direct a coating material into each of the apertures 203.

Additionally, the complex geometry component 202 also includes an aperture 213. The apertures 203 may be inlet apertures and the aperture 213 may be an outlet aperture, or vice versa. In various embodiments, the vapor deposition apparatus 201 is placed adjacent to one or more of the apertures 203 and/or adjacent to the aperture 213 to direct a coating material through one or more of the apertures 203, 213.

FIG. 2 illustrates two areas 204, 205 that are out of the line of sight of one or more apertures 203 and two areas 206, 207 that are within line of sight of one or more apertures 203 of the complex geometry component 202. Similar to the area 104, an interior substrate surface of the complex geometry component 202 at the areas 204, 205 is not within the line of sight of the apertures 203. In various embodiments, the line of sight is defined as a longitudinal axis that extends from the aperture 203 to an elbow, curve, or other feature of the component 202 and the longitudinal axis does not intersect the area 204, 205 of the interior substrate surface 223.

A local heater 210 is placed adjacent to, or in contact with, each of the areas 204, 205. Similar to the heater 110 discussed above, the heaters 210 are placed on or adjacent to an external surface 225 of the complex geometry component 202 such that energization of the heaters 210 increases the interior surface or substrate temperature of each of the areas 204, 205 to improve deposition efficiency.

The heaters 210 establish a thermal gradient between the interior substrate surface of the area 204 and the adjacent area 206 and the interior substrate surface of the area 205 and the adjacent area 207. In various embodiments, the thermal gradient may be at least 100 degrees. In various embodiments, a first thermal gradient established between the area 204 and the area 206 may be different from a second thermal gradient established between the area 205 and the area 207. In various embodiments, each of the first and second thermal gradients is at least one hundred (100) degrees. In various embodiments, if the component 202 was preheated, such as through placement in a heating chamber, the thermal gradient may be less than one hundred (100) degrees.

Figure 3:
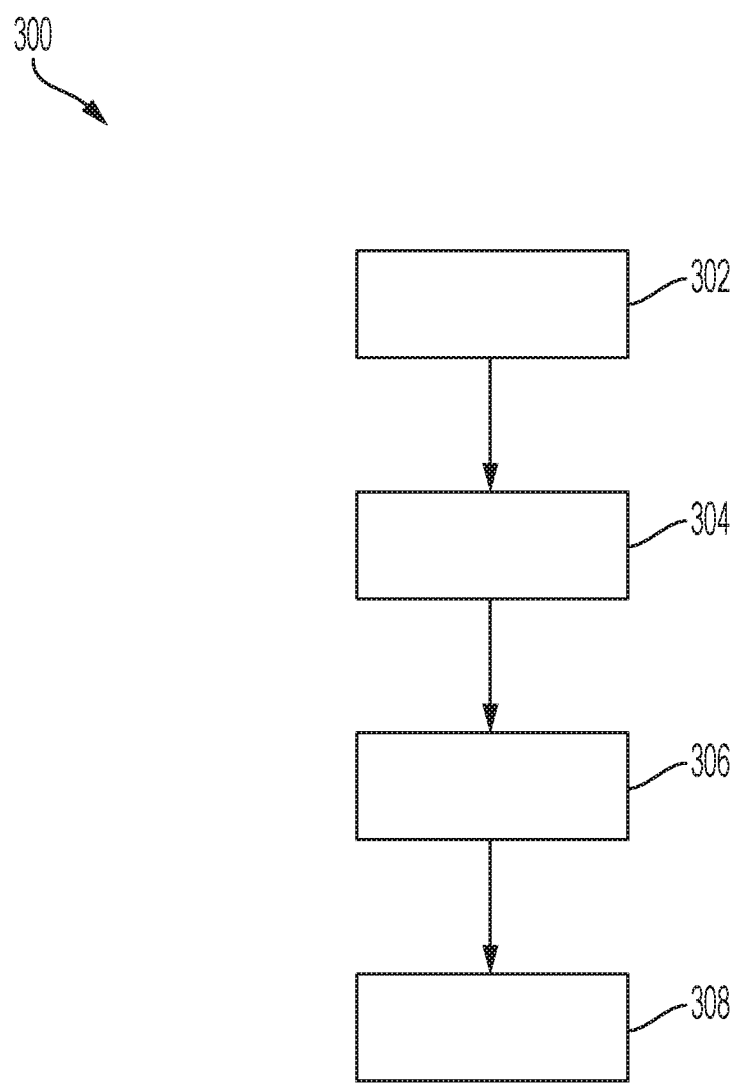
FIG. 3 is a flowchart diagram of a method for vapor deposition on complex geometry components, according to an embodiment of the invention.

FIG. 3 illustrates a method 300 for depositing a coating on the surface of a complex geometry component using vapor deposition. The method 300 can be utilized in connection with the systems 100 and 200 including complex geometry components illustrated in FIGS. 1 and 2, or with any other complex geometry component in which there is not a line of sight to the vapor deposition surface. Areas that are not within a line of sight of the vapor deposition apparatus are areas that are not visible from an aperture through which the vapor deposition material is applied to an interior substrate surface of the complex geometry component. These areas may not be visible from the aperture due to bends, curves, or other features of the component, for example and without limitation. The order of operation of the method 300 is not limited to the sequential execution as illustrated in FIG. 3, but may be performed in one or more varying orders, or steps may be performed simultaneously, as applicable in accordance with the present disclosure.

Initially, at 302, a complex geometry component is selected for vapor deposition. Next, at 304, one or more non-line of sight areas of the complex geometry component is identified. Once the non-line of sight areas have been identified, at 306, one or more heaters, such as the heaters 110, 210, is placed adjacent to or in contact with the one or more non-line of sight areas and the heater is energized to increase the surface free energy at the non-line of sight area. A thermal gradient is created by the heater such that the temperature of the substrate material of the complex geometry component is higher at the non-line of sight area than in surrounding, line of sight areas. The vapor deposition process continues at 308, with the heaters increasing the surface free energy at the non-line of sight areas to improve the adherence of the coating material in these areas.

In various embodiments, the method 300 is used to deposit any type of metallic material on a complex geometry component, including nickel (Ni) and nickel alloy and copper (Cu) and copper alloys, for example and without limitation. In various embodiments, the method 300 is used to deposit ceramic materials on the complex geometry component.

It should be emphasized that many variations and modifications may be made to the herein-described embodiments, the elements of which are to be understood as being among other acceptable examples. All such modifications and variations are intended to be included herein within the scope of this disclosure and protected by the following claims. Moreover, any of the steps described herein can be performed simultaneously or in an order different from the steps as ordered herein. Moreover, as should be apparent, the features and attributes of the specific embodiments disclosed herein may be combined in different ways to form additional embodiments, all of which fall within the scope of the present disclosure.

Conditional language used herein, such as, among others, "can," "could," "might," "may," "e.g.," and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

Moreover, the following terminology may have been used herein. The singular forms "a," "an," and "the" include plural referents unless the context clearly dictates otherwise. Thus, for example, reference to an item includes reference to one or more items. The term "ones" refers to one, two, or more, and generally applies to the selection of some or all of a quantity. The term "plurality" refers to two or more of an item. The term "about" or "approximately" means that quantities, dimensions, sizes, formulations, parameters, shapes and other characteristics need not be exact, but may be approximated and/or larger or smaller, as desired, reflecting acceptable tolerances, conversion factors, rounding off measurement error and the like and other factors known to those of skill in the art.

A plurality of items may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary. Furthermore, where the terms "and" and "or" are used in conjunction with a list of items, they are to be interpreted broadly, in that any one or more of the listed items may be used alone or in combination with other listed items. The term. "alternatively" refers to selection of one of two or more alternatives and is not intended to limit the selection to only those listed alternatives or to only one of the listed alternatives at a time, unless the context clearly indicates otherwise.

While exemplary embodiments are described above, it is not intended that these embodiments describe all possible forms encompassed by the claims. The words used in the specification are words of description rather than limitation, and it is understood that various changes can be made without departing from the spirit and scope of the disclosure. As previously described, the features of various embodiments can be combined to form further exemplary aspects of the present disclosure that may not be explicitly described or illustrated. While various embodiments could have been described as providing advantages or being preferred over other embodiments or prior art implementations with respect to one or more desired characteristics, those of ordinary skill in the art recognize that one or more features or characteristics can be compromised to achieve desired overall system attributes, which depend on the specific application and implementation. These attributes can include, but are not limited to cost, strength, durability, life cycle cost, marketability, appearance, packaging, size, serviceability, weight, manufacturability, ease of assembly, etc. As such, embodiments described as less desirable than other embodiments or prior art implementations with respect to one or more characteristics are not outside the scope of the disclosure and can be desirable for particular applications.

What is claimed is:

1. A method of depositing a layer of a material on an interior substrate surface of a component, comprising:
   providing the component having an aperture defining an edge of the interior substrate surface of the component, the component including at least one bend such that at least a portion of the interior substrate surface defining a first area is not visible from the aperture;
   providing a heating element adjacent to the first area of the component;
   energizing the heating element to raise a surface temperature of the first area, wherein the heating element creates a thermal gradient between the first area and a second area of the component adjacent to the first area such that a temperature of the interior substrate surface at the first area is greater than a temperature of the interior substrate surface at the second area; and
   providing a vapor deposition apparatus configured to deposit the layer of material on the interior substrate surface corresponding to the first area of the component.

2. The method of claim 1, wherein the heating element is a coil heater.

3. The method of claim 1, wherein the heating element is placed adjacent to an exterior surface of the component corresponding to the first area.

4. The method of claim 1, wherein the thermal gradient is at least one hundred (100) degrees Fahrenheit.

5. The method of claim 1, wherein the second area is visible from the aperture.

6. The method of claim 1, wherein the layer of material is comprised of one of a metallic material and a ceramic material.

7. The method of claim 6, wherein the metallic material is one of nickel, a nickel alloy, copper, and a copper alloy.

8. A method of depositing a coating layer of a material on an interior substrate surface of a component, comprising:
   providing the component having a first aperture defining an edge of a first interior substrate surface of the component and a second aperture defining an edge of a second interior substrate surface of the component, wherein at least a portion of the first interior substrate surface is a first area that is not within a line of sight of the first aperture and at least a portion of the second interior substrate surface is a second area that is not within a line of sight of the second aperture;
   providing a first heating element adjacent to the first area of the component;
   providing a second heating element adjacent to the second area of the component;
   energizing the first heating element to raise a surface temperature of the first area, wherein the first heating element creates a first thermal gradient between the first area and a third area of the component adjacent to the first area such that a temperature of the interior substrate surface at the first area is greater than a temperature of the interior substrate surface at the third area;

energizing the second heating element to raise a surface temperature of the second area;

vapor depositing a first coating on the first area; and vapor depositing a second coating on the second area.

9. The method of claim 8, wherein each of the first and second heating elements is a coil heater.

10. The method of claim 8, wherein the first heating element is placed adjacent to an exterior surface of the component corresponding to the first area and the second heating element is placed adjacent to an exterior surface of the component corresponding to the second area.

11. The method of claim 8, wherein a difference between a surface temperature at the first area and a surface temperature at the third area is greater than one hundred (100) degrees Fahrenheit.

12. The method of claim 8, wherein the second heating element creates a second thermal gradient between the second area and a fourth area of the component adjacent to the second area such that a temperature of the interior substrate surface at the second area is greater than a temperature of the interior substrate surface at the fourth area.

13. The method of claim 8, wherein the first coating is one of a metallic material and a ceramic material.

14. The method of claim 8, wherein the second coating is one of a metallic material and a ceramic material.

15. The method of claim 14, wherein the metallic material is one of nickel, a nickel alloy, copper, and a copper alloy.

* * * * *